US012013431B2

(12) United States Patent
Yu

(10) Patent No.: US 12,013,431 B2
(45) Date of Patent: Jun. 18, 2024

(54) METHOD AND TESTING APPARATUS RELATED TO WAFER TESTING

(71) Applicant: NANYA TECHNOLOGY CORPORATION, New Taipei (TW)

(72) Inventor: Ting Wei Yu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 451 days.

(21) Appl. No.: 17/353,833

(22) Filed: Jun. 22, 2021

(65) Prior Publication Data
US 2022/0404414 A1   Dec. 22, 2022

(51) Int. Cl.
*G01R 31/28* (2006.01)
(52) U.S. Cl.
CPC ..... *G01R 31/2858* (2013.01); *G01R 31/2886* (2013.01)
(58) Field of Classification Search
CPC ............ G01R 31/2858; G01R 31/2886; G01R 31/2894; G11C 29/006; G11C 29/44; G11C 29/56008
See application file for complete search history.

(56) References Cited

U.S. PATENT DOCUMENTS

| | | | | |
|---|---|---|---|---|
| 5,838,951 | A * | 11/1998 | Song | H01L 23/544 |
| | | | | 257/E23.179 |
| 6,774,620 | B2 * | 8/2004 | Nanbu | G01N 21/9501 |
| | | | | 324/762.02 |
| 9,437,506 | B2 * | 9/2016 | Hessinger | H01L 22/20 |
| 2002/0032888 | A1 * | 3/2002 | Ott | H01L 22/20 |
| | | | | 714/724 |
| 2009/0070055 | A1 * | 3/2009 | Long | H01L 22/12 |
| | | | | 702/81 |

FOREIGN PATENT DOCUMENTS

CN         102376599 A  *  3/2012

* cited by examiner

*Primary Examiner* — Daniel R Miller
*Assistant Examiner* — Edgar I Jimenez
(74) *Attorney, Agent, or Firm* — JCIPRNET

(57) ABSTRACT

A method and a testing apparatus related to wafer testing are provided. In the method, testing raw data is obtained by a testing apparatus operating with a Unix-related system. The testing raw data is a testing result of probe testing on one or more wafers by the testing apparatus. The testing raw data is converted into converted data by the testing apparatus. The converted data is related to the defect information of the wafer. Analyzed data is generated by the testing apparatus according to the converted data. The analyzed data is used for a graphical interface. Therefore, real-time defect analysis during the testing procedure may be provided.

6 Claims, 10 Drawing Sheets

METHOD AND TESTING APPARATUS RELATED TO WAFER TESTING

BACKGROUND OF THE DISCLOSURE

1. Field of the Disclosure

The present disclosure generally relates to the wafer testing field, in particular, to a method and a testing apparatus related to wafer testing.

2. Description of Related Art

In one of the objectives of the wafer testing, fail bits on the wafer are checked based on one or more testing patterns and conditions, and these fail bits may be fixed through a backup circuit. Regarding the advanced manufacturing process, there may be lots of dies on one wafer, and the memory capacity may also be large, so as to enlarge the data amount of defect analysis. However, a massive data amount may affect the efficiency of defect analysis and new product development. If the defect analysis can be completed during the probe testing, the developer may find out the manufacturing problem of the product and a proper solution as soon as possible.

Taking memory as an example, after probe testing on the wafer of the memory, a testing program may compare the testing result with a previous version and further perform a correction. There would be a need to speed up the development and repeat verification of the testing program.

SUMMARY OF THE DISCLOSURE

Accordingly, the present disclosure is directed to a method and a testing apparatus related to wafer testing, to improve the efficiency of defect analysis.

In one of the exemplary embodiments, a method related to wafer testing, includes, but is not limited thereto, the following steps. Testing raw data is obtained by a testing apparatus operating with a Unix-related system. The testing raw data is a testing result of probe testing on one or more wafers by the testing apparatus. The testing raw data is converted into converted data by the testing apparatus. The converted data is related to the defect information of the wafer. Analyzed data is generated by the testing apparatus according to the converted data. The analyzed data is used for a graphical interface.

In one of the exemplary embodiments, a testing apparatus related to wafer testing includes, but is not limited thereto, a memory and a processor. The memory is used for storing program code. The processor is coupled to the memory. The processor is used for loading and executing the program code to be configured for performing the following steps. The processor operates with a Unix-related system, obtains testing raw data, converts the testing raw data into a converted data, and generates analyzed data according to the converted data. The testing raw data is a testing result of probe testing on one or more wafers by the testing apparatus. The converted data is related to the defect information of the wafer. The analyzed data is used for a graphical interface.

It should be understood, however, that this Summary may not contain all of the aspects and embodiments of the present disclosure, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
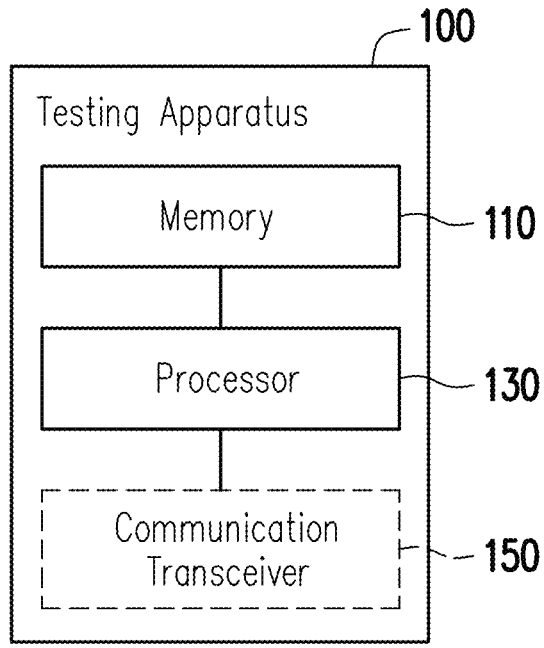
FIG. 1 is a block diagram illustrating a testing apparatus according to one of the exemplary embodiments of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1 is a block diagram illustrating a testing apparatus 100 according to one of the exemplary embodiments of the disclosure. Referring to FIG. 1, the testing apparatus 100 includes, but is not limited to, a memory 110 and a processor 130. The testing apparatus 100 is used for wafer testing. For example, the testing apparatus 100 could be a wafer prober or automatic test equipment related to probe testing on a wafer. In some embodiments, the testing apparatus 100 may include or be connected with one or more microscopic contacts, test heads or probes called a probe card.

The memory 110 may be any type of a fixed or movable random-access memory (RAM), a read-only memory (ROM), a flash memory, a similar device, or a combination of the above devices. In one embodiment, the memory 110 may store program codes, device configurations, buffer data, or permanent data (such as testing data, converted data, or analyzed data), and these data would be introduced later.

The processor 130 is coupled to the memory 110. The processor 130 is configured to load and execute the program code stored in the memory 110, to perform a procedure of the exemplary embodiment of the disclosure.

In some embodiments, the processor 130 may be a central processing unit (CPU), a microprocessor, a microcontroller, a graphics processing unit (GPU), a digital signal processing (DSP) chip, a field-programmable gate array (FPGA). In still some embodiments, the functions of the processor 130 may also be implemented by an independent electronic device or an integrated circuit (IC), and operations of the processor 130 may also be implemented by software.

In one embodiment, the processor 130 operates with a Unix-related system. The Unix-related system could be Unix or Linux operating system (OS) and may be different from the Windows OS. For example, the Linux OS could be SuSE or CentOS. One or more testing programs are executed on the Unix-related system. For example, a testing program generates testing patterns for the wafer.

In some embodiments, the testing apparatus 100 further includes a communication transceiver 150 coupled to the processor 130. The communication transceiver 150 could be a serial peripheral interface (SPI), an inter-integrated circuit (I2C), a universal asynchronous receiver transmitter (UART), or another physical interface. Alternatively, the communication transceiver 150 could be Wi-Fi, Bluetooth, or mobile network supported transceiver. In one embodiment, the communication transceiver 150 is used to communicate with an external apparatus (such as a computer or a smartphone). For example, a developer may use a computer to log in to the Unix-related system operated on the testing apparatus 100.

To better understand the operating process provided in one or more embodiments of the disclosure, several embodiments will be exemplified below to elaborate the testing apparatus 100. The devices and modules in the testing apparatus 100 are applied in the following embodiments to explain the method related to multiple modes provided herein. Each step of the method can be adjusted according to actual implementation situations and should not be limited to what is described herein.

Figure 2:
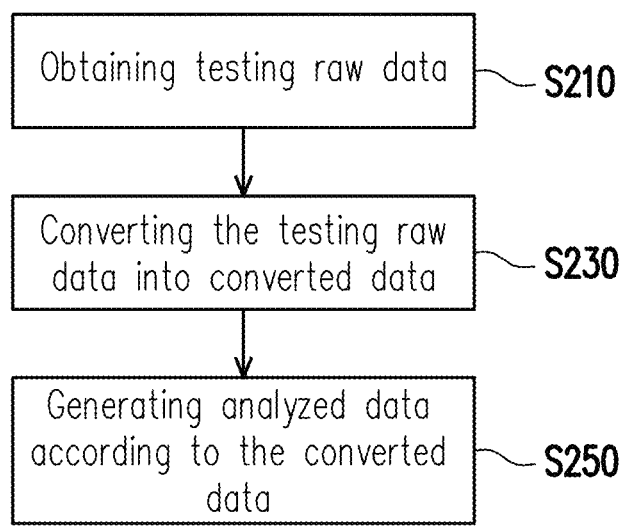
FIG. 2 is a flowchart illustrating a method according to one of the exemplary embodiments of the disclosure.

FIG. 2 is a flowchart illustrating a method according to one of the exemplary embodiments of the disclosure. Referring to FIG. 2, the processor 130 may obtain testing raw data (step S210). Specifically, the testing raw data is a testing result of probe testing on one or more wafers by the testing apparatus 100. The testing result is related to various types of faults, defects, or errors and/or measured values on the wafer. In one embodiment, the testing result may include locations/addresses of fail/error sub-unit (such as bit, memory cell, die, or chip), bin identifier, and/or direct current (DC) value.

For example, a memory test, which provides address sequences and test data sequences related to one or more testing patterns to the memory, is performed by testing circuitry of the testing apparatus 100, and the test results are recorded in the memory 110 for being accessed by, or transmission to, the processor 130. In one embodiment, all tests to be done on the memory block are performed first, and complete test results are provided to the processor 130 at the beginning of the method. In another embodiment, tests to be done are performed concurrently with, or in response to, one or more operations in the method.

The processor 130 may convert the testing raw data into converted data (step S230). Specifically, the testing raw data is configured with a specific file format based on the testing program. For example, the Advantest program is configured with Advantest language (ATL). For subsequent defect analysis, a file conversion would be performed on the testing raw data, to generate the converted data. The converted data is readable by the Unix-related system operated on the testing apparatus 100. The converted data is related to defect information of one or more wafers.

In one embodiment, the converted data includes one or more defect locations of the wafer. The defect location is the address of the fail/error sub-unit. It should be noticed that, regarding the wafer of memory, the defect information is configured with multiple column lines and multiple row lines. A crossing region of one column line and one row line is a sub-unit of one wafer. The sub-unit could be a memory cell/block, a bit, a die, a chip, or another unit based on the actual requirement.

In one embodiment, the converted data includes one or more DC values of the sub-units of the wafer. In one embodiment, the converted data includes the bin identifications of the sub-units of the wafer. For example, bin value of 1 for a good bin, and bin 10 for an open circuit. In one embodiment, the converted data includes the identifier of the wafer, Lot (i.e., a set of wafers), and/or chip.

The processor 130 may generate analyzed data according to the converted data (step S250). Specifically, the analyzed data is used for a graphical interface. The graphical interface may be developed by XView or another window system application. The graphical interface would be displayed on a display. In one embodiment, the display could be embedded in or externally connected with testing apparatus 100. In another embodiment, an external apparatus may log in to the testing apparatus 100 through remote control, and the graphical interface may be displayed on the display of the external apparatus.

In one embodiment, the analyzed data may include an information map. The information map shows the defect information at a global view of the wafer. The processor 130 may generate the information map configured with the column lines and the row lines.

Figure 3:
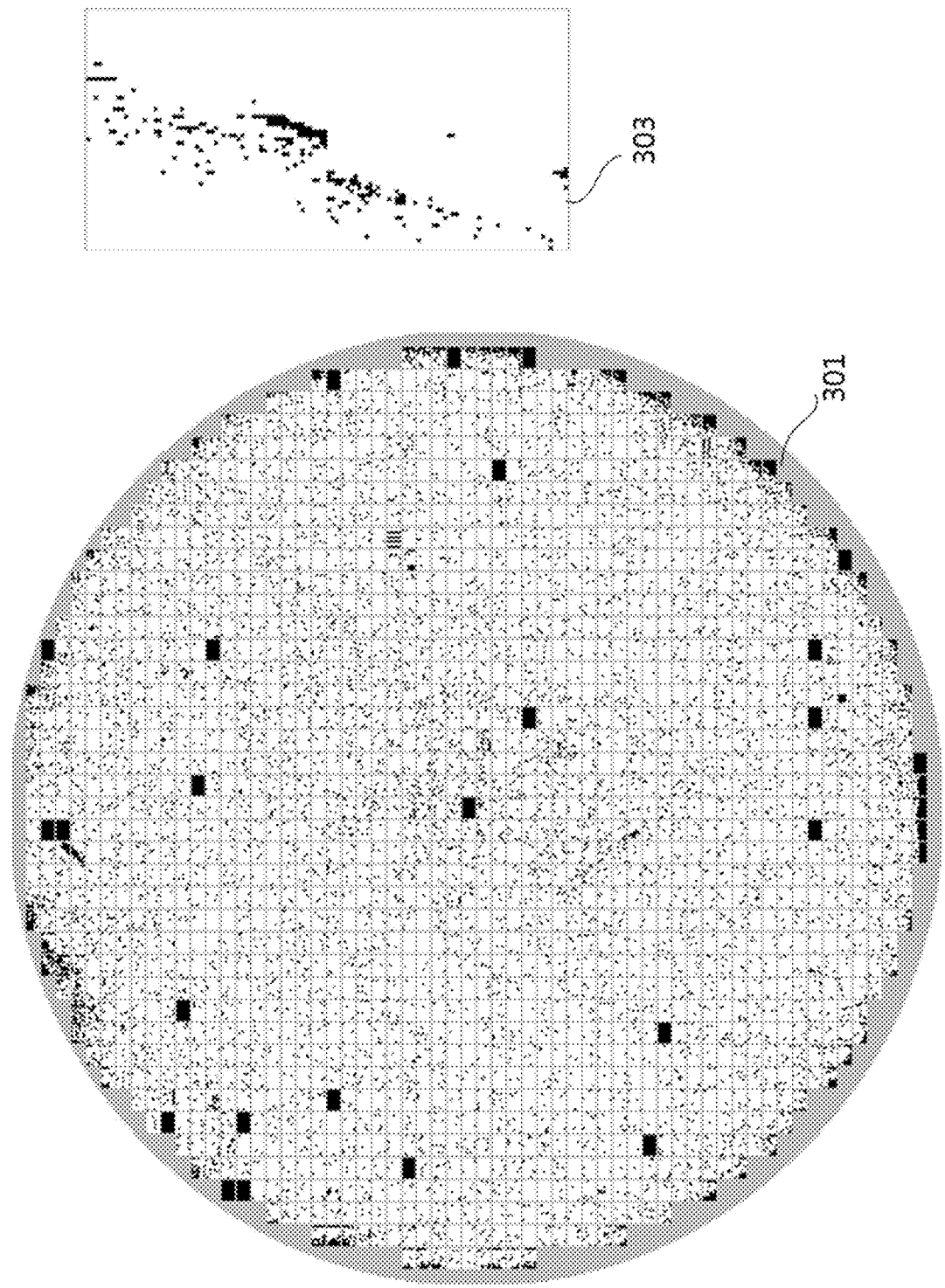
FIG. 3 is a fail region latch (FRL) map of one wafer according to one of the exemplary embodiments of the disclosure.

In one embodiment, the information map is a fail region latch (FRL) map. FIG. 3 is an FRL map 301 of one wafer according to one of the exemplary embodiments of the disclosure. Referring to FIG. 3, one fail region may correspond to a bit, a memory cell, or another sub-unit of the wafer which is determined as a defect. In response to a selection of one chip or die, a zoom-in window 303 would show a complete FRL of the selected chip or die.

Figure 4:
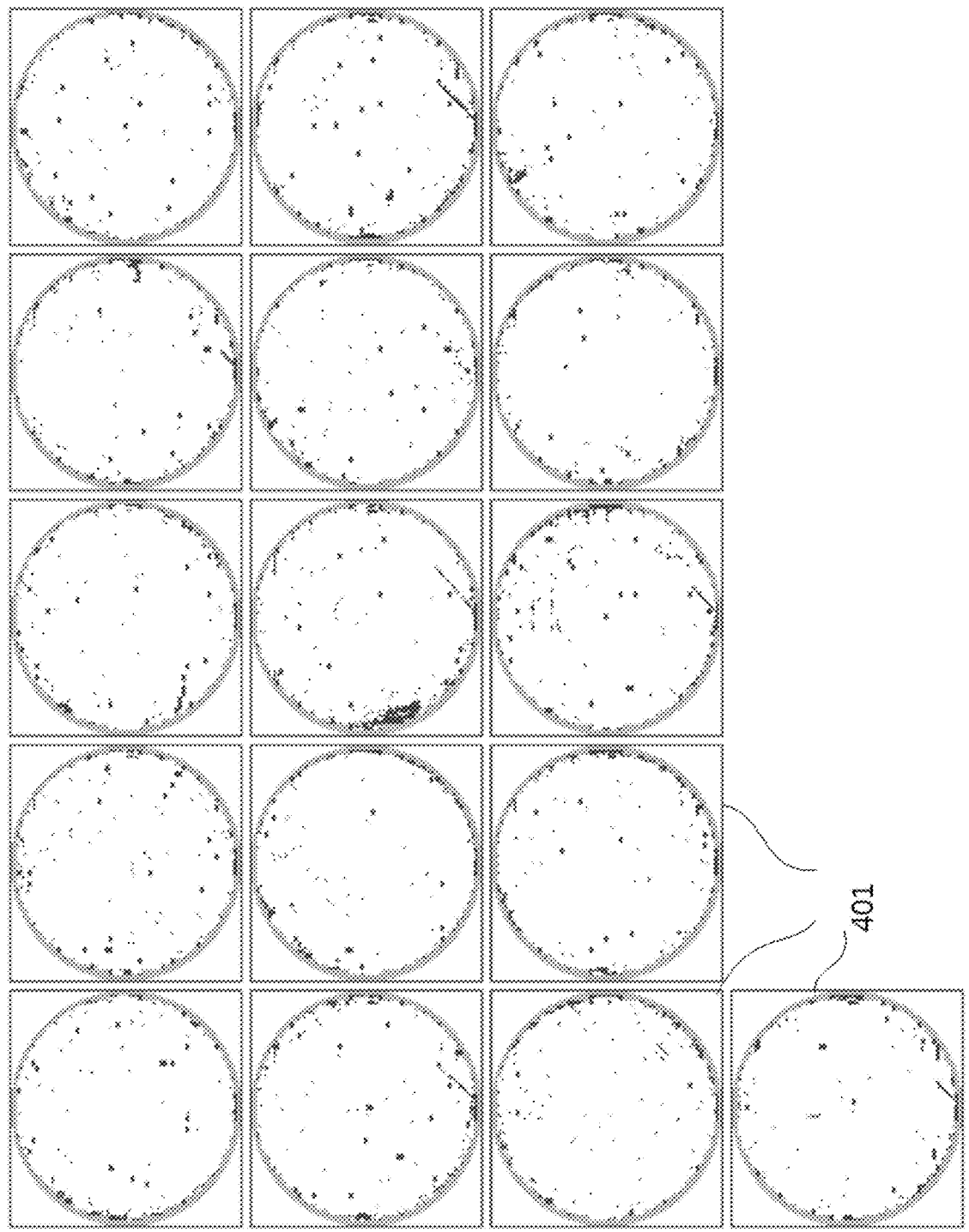
FIG. 4 is FRL maps of a set of wafers according to one of the exemplary embodiments of the disclosure.

FIG. 4 is FRL maps 401 of a set of wafers according to one of the exemplary embodiments of the disclosure. Referring to FIG. 4, in response to a selection of one Lot (i.e., the set of wafers), FRL maps 401 of multiple wafers of the selected Lot would be presented on the graphical interface.

In one embodiment, the processor 130 may overlap the FRL maps of multiple wafers based on corresponding column lines and corresponding row lines. Hence, the one column line of one map would be aligned with the same column line of another map, and one row line of one map would be aligned with the same row line of another map.

Figure 5:
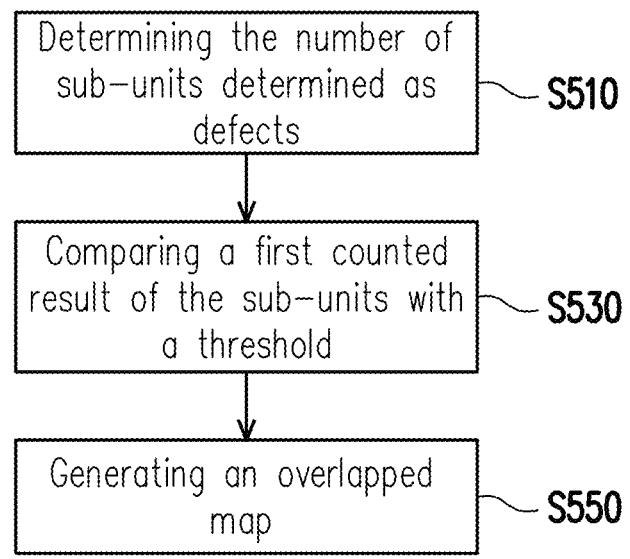
FIG. 5 is a flowchart illustrating a generation of an overlapped map according to one of the exemplary embodiments of the disclosure.

FIG. 5 is a flowchart illustrating a generation of an overlapped map according to one of the exemplary embodiments of the disclosure. Referring to FIG. 5, the processor 130 may count the number of the sub-units determined as defects at each location (step S510). The location is where the crossing region of a column line and a row line is located. The processor 130 may compare the first counted result of the sub-units determined as defects with one or more thresholds (step S530). For example, the threshold is 5, 10, or 50. The processor 130 may generate an overlapped map of the wafers according to a compared result with the threshold (step S550). If the compared result is that the first counted result is larger than the first threshold, the fail region may be configured with a first color. If the compared result is the first counted result is larger than the second threshold, the fail region may be configured with a second color different from the first color.

In some embodiments, in response to a selection of multiple reference specs, the processor 130 may configure different visual appearances for different reference specs. For example, a first fail region is determined by comparing with a first reference spec and configured with a third color, and a second fail region is determined by comparing with a second reference spec and configured with a fourth color.

Figure 6:
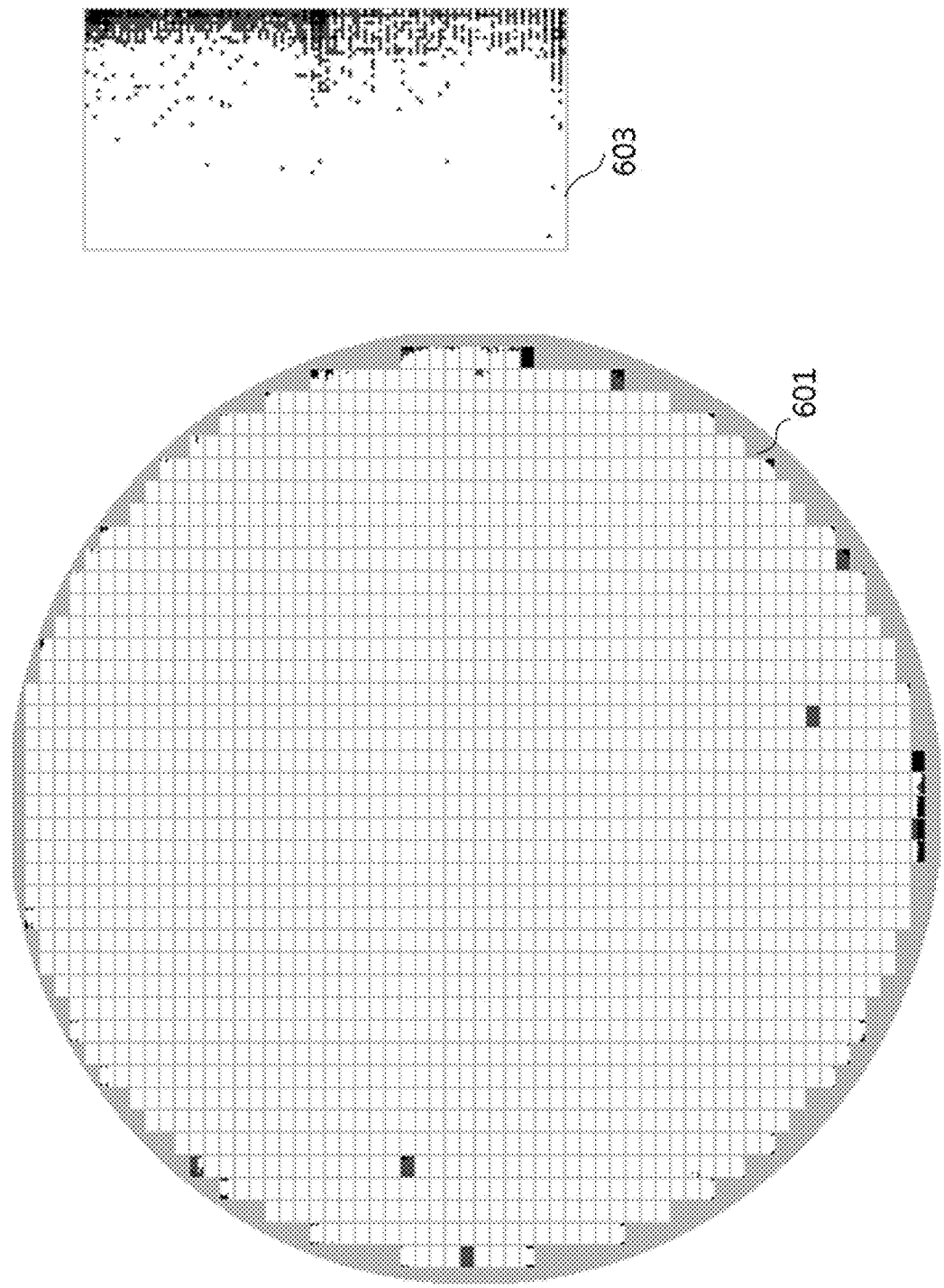
FIG. 6 is an overlapped map of a set of wafers according to one of the exemplary embodiments of the disclosure.

FIG. 6 is an overlapped map 601 of a set of wafers according to one of the exemplary embodiments of the disclosure. Referring to FIG. 6, for example, a specific Lot is selected, and the overlapped map 601 can be presented by comparing with two specs. The black color corresponds to the first spec, and the gray color corresponds to the second spec. Furthermore, in response to a selection of one chip or die, a zoom-in window 603 would show a complete FRL of the selected chip or die.

In one embodiment, the processor 130 may count the number of sub-units corresponding to one or more classified items. The classified items are related to defect location, testing pattern, or DC value. The processor 130 may generate an accumulated chart according to a second counted result of the classified items. The second counted result includes the number of sub-units corresponding to the classified items.

Figure 7A:
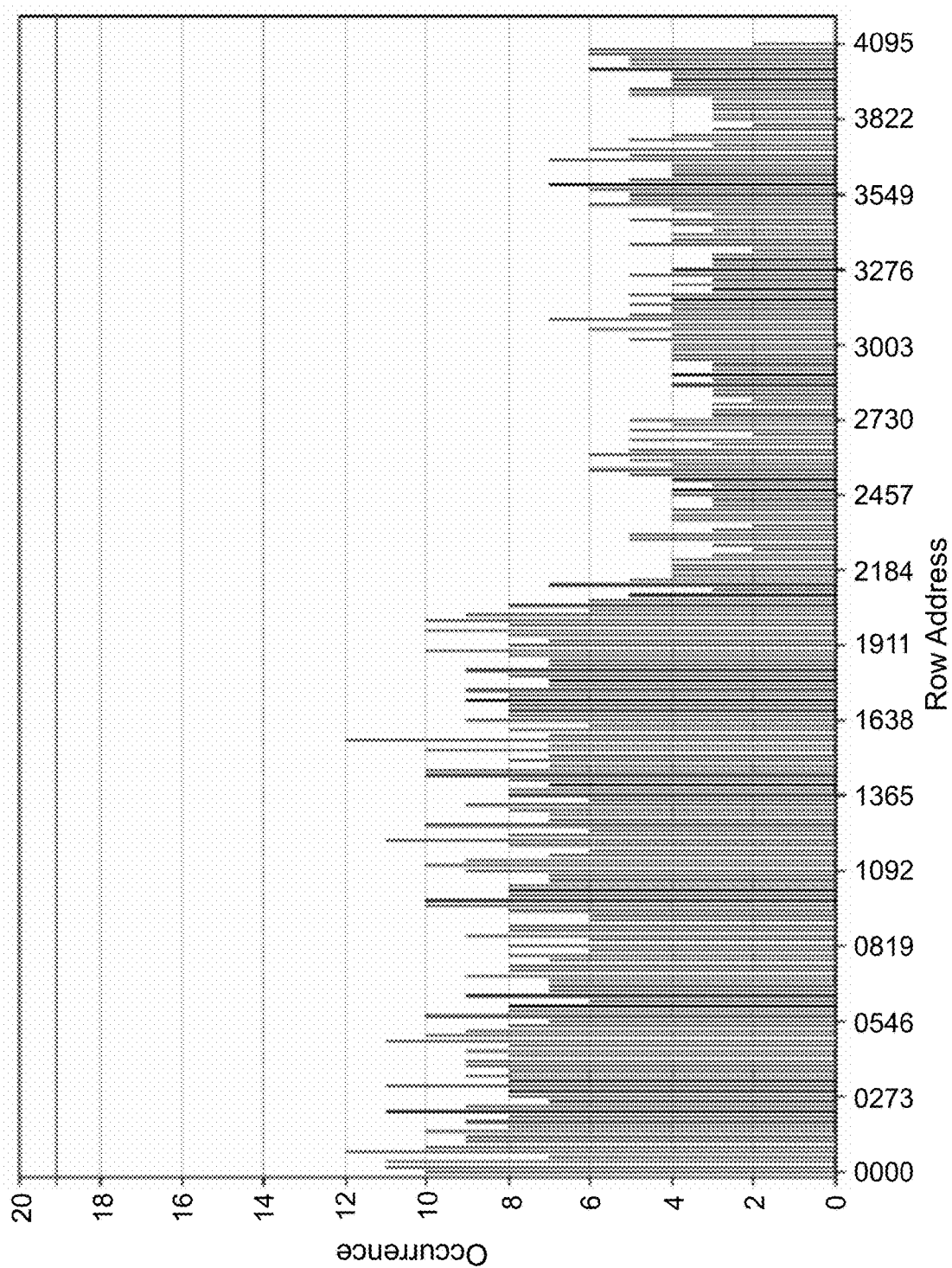
FIG. 7A is a fail address distribution of multiple wafers according to one of the exemplary embodiments of the disclosure.

In one embodiment, the accumulated chart is a fail address distribution. For example, FIG. 7A is a fail address distribution of multiple wafers according to one of the exemplary embodiments of the disclosure. Referring to FIG. 7A, in response to a selection of a range of row addresses, the occurrence count of fail sub-unit (i.e., the second counted result) located at each selected row address can be presented.

Figure 7B:
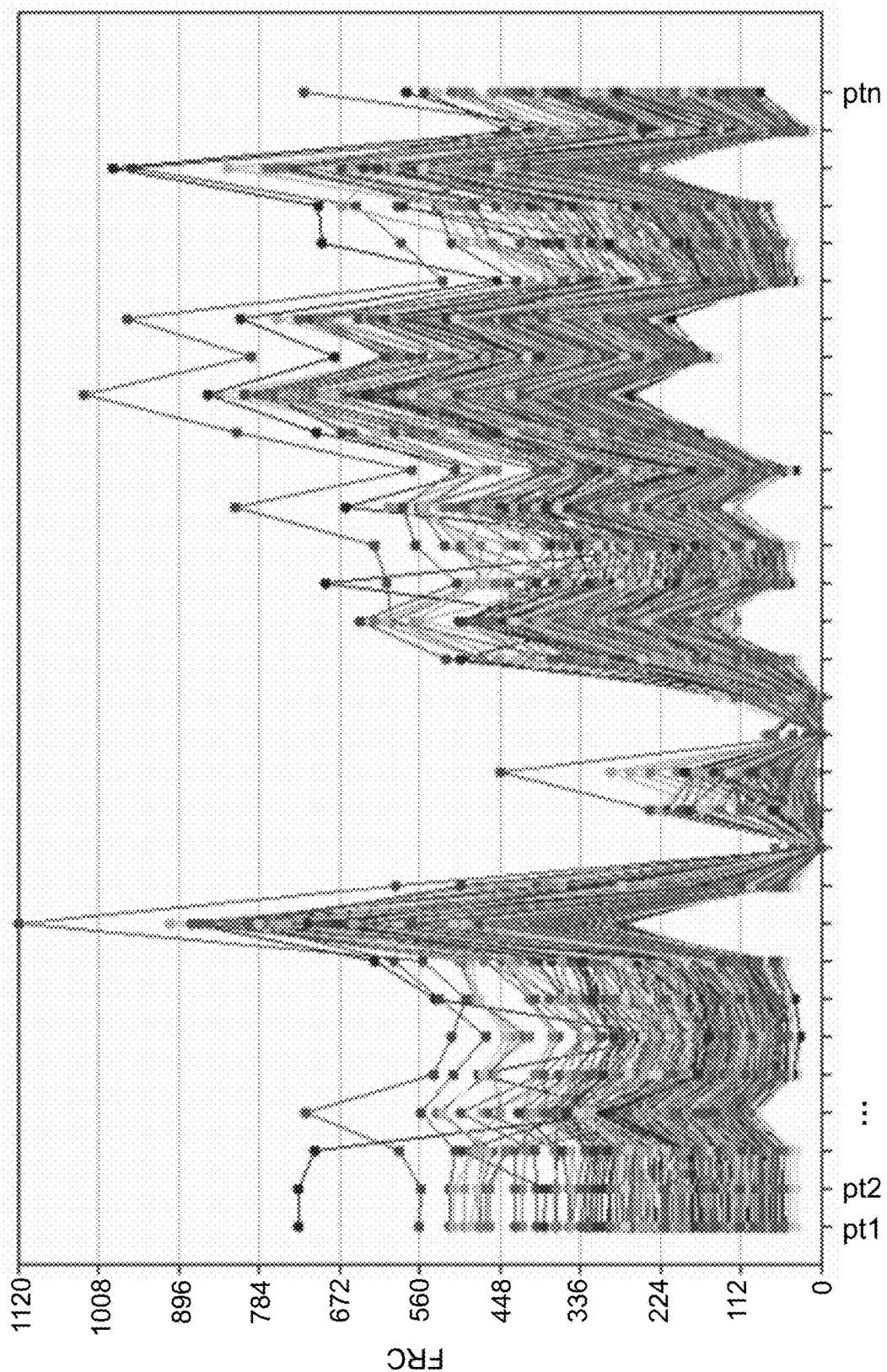
FIG. 7B is a fail region count (FRC) of multiple wafers according to one of the exemplary embodiments of the disclosure.

In one embodiment, the accumulated chart is a fail region count (FRC). For example, FIG. 7B is an FRC of multiple wafers according to one of the exemplary embodiments of the disclosure. Referring to FIG. 7B, in response to a selection of one or more testing patterns, the fail region counts (i.e., the amount of the fail region) of fail sub-unit (i.e., the second counted result) corresponding selected testing patterns can be presented.

Figure 8:
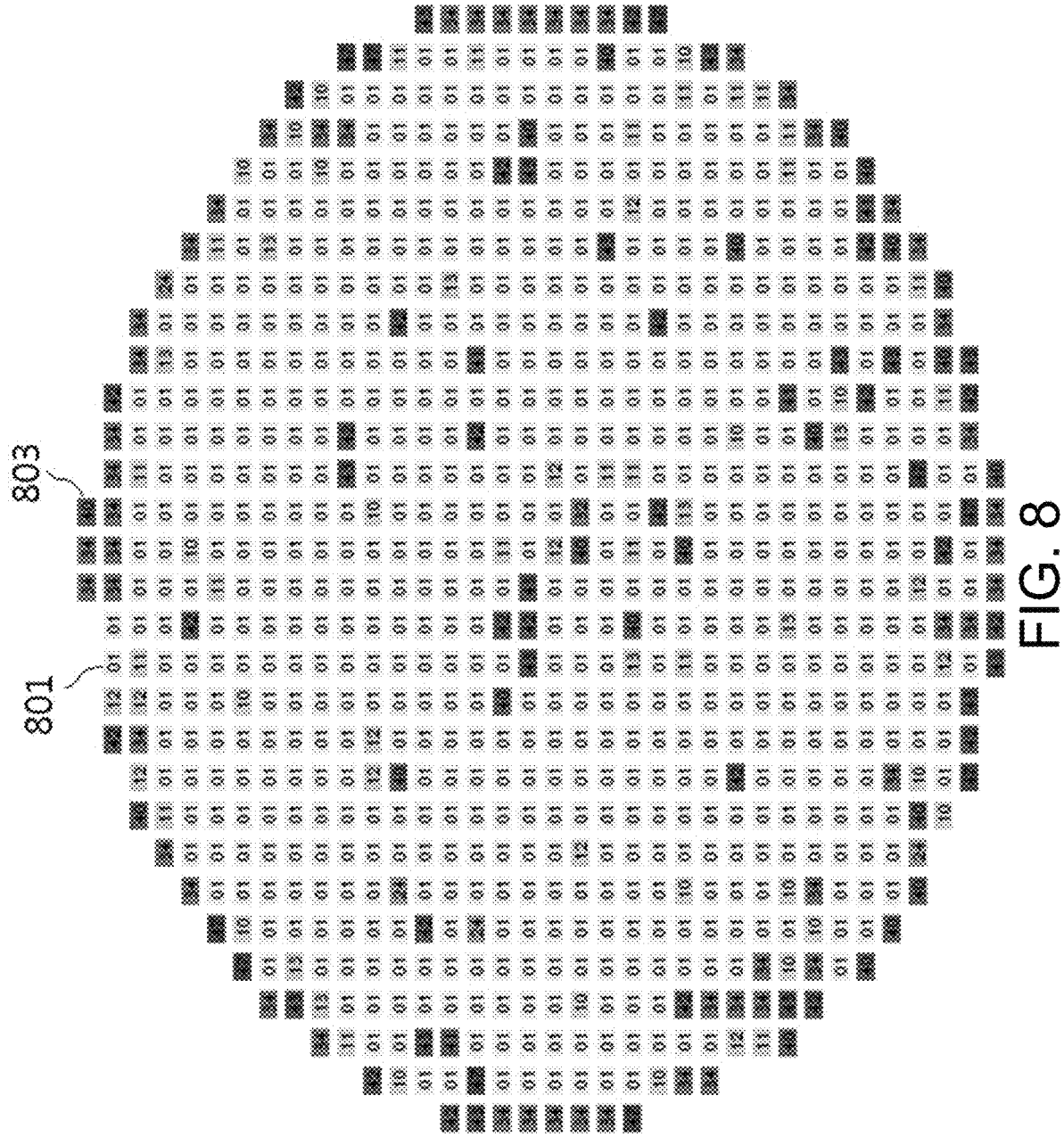
FIG. 8 is a bin map of a wafer according to one of the exemplary embodiments of the disclosure.

In one embodiment, the information map is a bin map. FIG. 8 is a bin map of a wafer according to one of the exemplary embodiments of the disclosure. Referring to FIG. 8, a bin identification would be shown on each die. For example, "01" is a good bin 801, and "40" is another bin 801 determined as a specific fail result.

In one embodiment, the information map is a DC map. A DC value would be shown on the location of each die/chip.

In some embodiments, the information map could be another measured value map. The measured value may be related to voltage, current, impedance, or another electrical characteristic. A measured value would be shown on the location of each die/chip.

Figure 9:
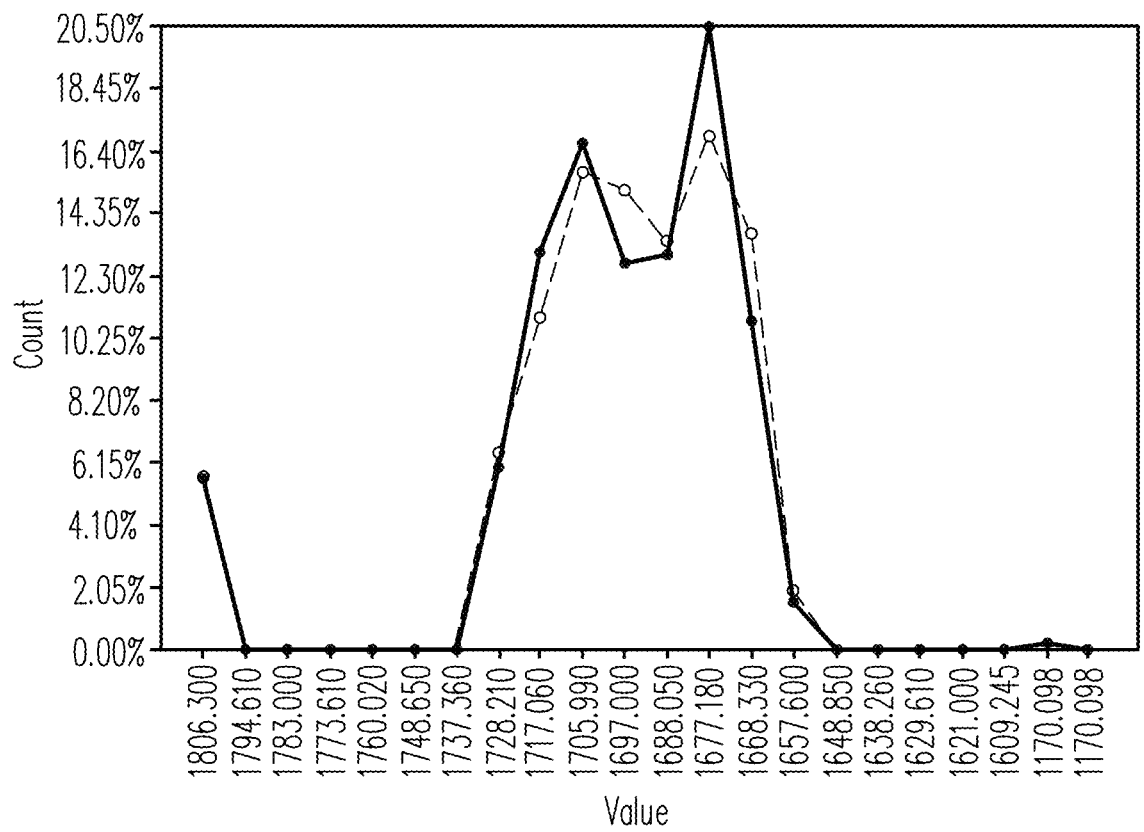
FIG. 9 is a direct current (DC) distribution of a wafer according to one of the exemplary embodiments of the disclosure.

In one embodiment, the accumulated chart is a DC distribution. For example, FIG. 9 is a DC distribution of a wafer according to one of the exemplary embodiments of the disclosure. Referring to FIG. 9, in response to a selection of multiple DC values, the counts (i.e., the ratio of the amount of the sub-unit corresponding to the second counted result) corresponding selected DC values can be presented.

Figure 10A:
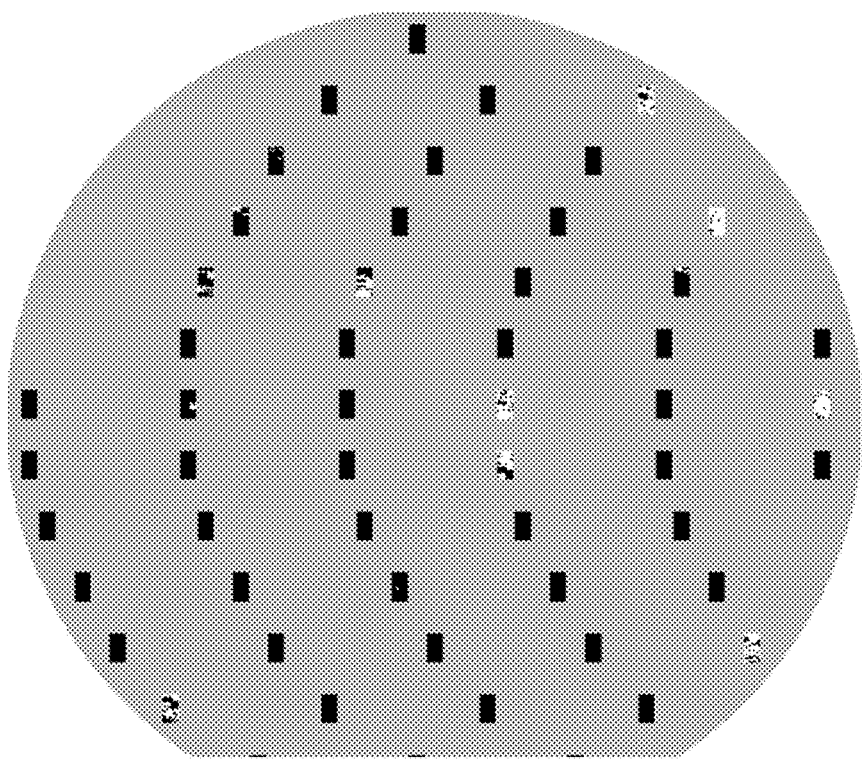
FIG. 10A and FIG. 10B are examples of fail filter according to one of the exemplary embodiments of the disclosure.
Figure 10B:
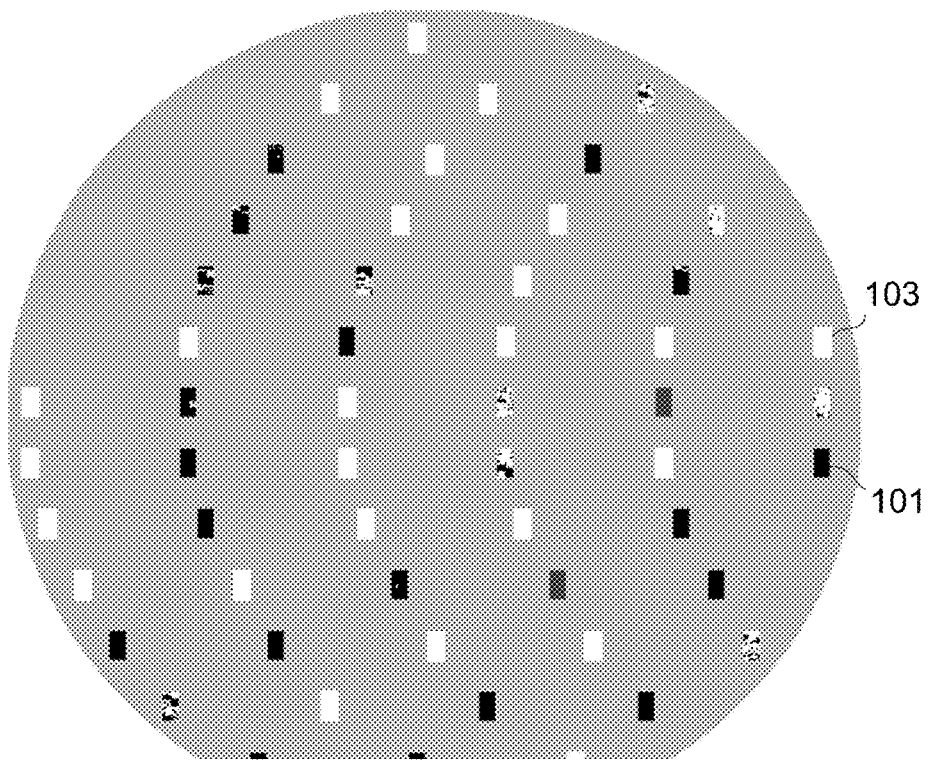

FIG. 10A and FIG. 10B are examples of fail filter according to one of the exemplary embodiments of the disclosure. Referring to FIG. 10A, an original FRL map shows multiple defect types. Referring to FIG. 10B, in response to a selection of DC fail, the processor 130 may re-draw the FRL map, where the fail region determined as DC fail would be erased or configured with a different color. For example, two regions 101 and 103 are determined as different fail types. It should be noticed that the fail filter may be configured with another defect type different from the DC fail in another embodiment.

In some embodiments, the processor 130 may compare the test time of each test item or each testing pattern.

In summary, according to the method and the testing apparatus related to wafer testing, in response to obtaining the testing result of the probe testing, the testing apparatus operating with Unix-related system may directly convert the testing raw data and further generate analyzed data used for being presented on the graphical interface. Compared with conventional Windows OS-based defect analysis, the defect analysis may be performed on the testing apparatus directly, so as to provide real-time defect analysis.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A method related to wafer testing, comprising:
obtaining, by a testing apparatus operating with a Unix-related system, testing raw data, wherein the testing raw data is a testing result of probe testing on at least one wafer by the testing apparatus;
converting, by the testing apparatus, the testing raw data into converted data, wherein the converted data is related to defect information of the at least one wafer; and
generating, by the testing apparatus, analyzed data according to the converted data, wherein the analyzed data is used for a graphical interface, the defect information is configured with column lines and row lines, a crossing region of one of the column lines and one of the row lines is a sub-unit of one of the at least one wafer, and the step of generating the analyzed data comprises:
generating, by the testing apparatus, an information map configured with the column lines and the row lines, wherein the information map shows the defect information at a global view of the at least one wafer, the analyzed data comprises the information map, the information map is a fail region latch (FRL) map, the converted data comprises at least one defect location of the at least one wafer, the at least one wafer comprises a set of a plurality of the wafers; and
overlapping, by the testing apparatus, the FRL maps of the plurality of the wafers based on corresponding column lines and corresponding row lines as an overlapped map, comprising:
counting, by the testing apparatus, a number of a plurality of the sub-units determined as defects at each location of the sub-units of the set of the plurality of the wafers;
comparing, by the testing apparatus, a first counted result of the plurality of the sub-units as the defects at the set of the plurality of the wafers with a threshold; and
generating, by the testing apparatus, the overlapped map of the plurality of wafers in which a fail region corresponding to the one of the sub-units is configured with a first color if the first counted result is larger than the threshold.

2. The method according to claim 1, wherein the information map is a direct current (DC) map, the converted data comprises at least one DC value of the at least one wafer.

3. The method according to claim 1, wherein the step of generating the analyzed data further comprises:

counting, by the testing apparatus, a number of a plurality of the sub-units corresponding to a plurality of classified items, wherein the plurality of classified items are related to one of defect location, testing pattern, and DC value; and generating, by the testing apparatus, an accumulated chart according to a second counted result of the plurality of classified items.

4. A testing apparatus related to wafer testing, comprising:

a memory, storing program code; and a processor, coupled to the memory, loading and executing the program code to be configured for:

operating with a Unix-related system;

obtaining testing raw data, wherein the testing raw data is a testing result of probe testing on at least one wafer by the testing apparatus;

converting the testing raw data into converted data, wherein the converted data is related to defect information of the at least one wafer; and generating analyzed data according to the converted data, wherein the analyzed data is used for a graphical interface, the defect information is configured with column lines and row lines, a crossing region of one of the column lines and one of the row lines is a sub-unit of one of the at least one wafer, and the processor is further configured for:

generating an information map configured with the column lines and the row lines, wherein the information map shows the defect information at a global view of the at least one wafer, the analyzed data comprises the information map, the information map is a fail region latch (FRL) map, the converted data comprises at least one defect location of the at least one wafer, the at least one wafer comprises a set of a plurality of the wafers; and overlapping the FRL maps of the plurality of the wafers based on corresponding column lines and corresponding row lines as an overlapped map, comprising:

counting a number of a plurality of the sub-units determined as defects at each location of the sub-units of the set of the plurality of the wafers;

comparing a first counted result of the plurality of the sub-units as the defects at the set of the plurality of the wafers with a threshold; and generating the overlapped map of the plurality of wafers in which a fail region corresponding to the one of the sub-units is configured with a first color if the first counted result is larger than the threshold.

5. The testing apparatus according to claim 4, wherein the information map is a direct current (DC) map, the converted data comprises at least one DC value of the at least one wafer.

6. The testing apparatus according to claim 4, wherein the processor is further configured for:

counting a number of a plurality of the sub-units corresponding to a plurality of classified items, wherein the plurality of classified items are related to one of defect location, testing pattern, and DC value; and generating an accumulated chart according to a second counted result of the plurality of classified items.

* * * * *